(12) United States Patent
Min et al.

(10) Patent No.: US 8,624,375 B2
(45) Date of Patent: Jan. 7, 2014

(54) SEMICONDUCTOR PACKAGE FOR SELECTING SEMICONDUCTOR CHIP FROM A CHIP STACK

(75) Inventors: Bok Gyu Min, Icheon-si (KR); Joon Ki Hong, Icheon-si (KR); Tae Hoon Kim, Icheon-si (KR); Da Un Nah, Seoul (KR); Jae Joon Ahn, Icheon-si (KR); Ki Bum Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 420 days.

(21) Appl. No.: 12/981,463

(22) Filed: Dec. 29, 2010

(65) Prior Publication Data
US 2012/0032342 A1 Feb. 9, 2012

(30) Foreign Application Priority Data
Aug. 5, 2010 (KR) .................. 10-2010-0075740

(51) Int. Cl.
*H01L 23/52* (2006.01)

(52) U.S. Cl.
USPC ........... 257/686; 257/777; 257/700; 257/725; 257/685; 257/E21.499

(58) Field of Classification Search
USPC ......... 257/777, 686, 685, 723–724, 700, 725, 257/E21.499
See application file for complete search history.

(56) References Cited

U.S. PATENT DOCUMENTS

| 6,448,661 | B1* | 9/2002 | Kim et al. ............. 257/777 |
| 8,338,890 | B2* | 12/2012 | Saiki et al. ............. 257/355 |
| 2004/0046262 | A1* | 3/2004 | Watanabe et al. ............. 257/777 |
| 2008/0088031 | A1 | 4/2008 | Kwon et al. |
| 2009/0121346 | A1* | 5/2009 | Wachtler ............. 257/724 |
| 2009/0289701 | A1 | 11/2009 | Silvestri |
| 2010/0002485 | A1 | 1/2010 | Janzen |
| 2011/0079923 | A1* | 4/2011 | Suh ............. 257/777 |

FOREIGN PATENT DOCUMENTS

| JP | 2000049277 A | 2/2000 |
| KR | 1020090034785 A | 4/2009 |

* cited by examiner

*Primary Examiner* — S. V. Clark
*Assistant Examiner* — Krista Soderholm
(74) *Attorney, Agent, or Firm* — William Park & Associates Patent Ltd.

(57) ABSTRACT

A semiconductor package includes: first, second, third and fourth semiconductor chips stacked while having the arrangement of chip selection vias; and a connection unit provided between a second semiconductor chip and a third semiconductor chip, and configured to mutually connect some of the chip selection vias of the second and third semiconductor chips and disconnect the others of the chip selection vias of the second and third semiconductor chips, wherein the first and second semiconductor chips and the third and fourth semiconductor chips are stacked in a flip chip type.

37 Claims, 11 Drawing Sheets

SEMICONDUCTOR PACKAGE FOR SELECTING SEMICONDUCTOR CHIP FROM A CHIP STACK

CROSS-REFERENCES TO RELATED APPLICATIONS

The present application claims priority under 35 U.S.C 119(a) to Korean Application No. 10-2010-0075740, filed on Aug. 5, 2010, in the Korean intellectual property Office, which is incorporated herein by reference in its entirety.

BACKGROUND

Exemplary embodiments of the present invention relate generally to a semiconductor technology, and more particularly, to a semiconductor package which is capable of selecting chips by using through-vias.

Many attempts have been made to develop a package technology which can provide improved electric performance, store large amounts of data, rapidly process the stored data and provide a slim, compact and lightweight semiconductor device. A semiconductor package technology has been proposed which improves a storage capacity and a processing speed by stacking a plurality of semiconductor chips. Various techniques for electrically coupling the stacked semiconductor chips have been proposed. One of effective techniques is to mutually connect the stacked chips using through-vias, such as through-silicon vias (TSVs), which pass through the semiconductor chips.

In a semiconductor package in which stacked semiconductor chips are electrically connected together using through-vias, the through-vias passing through the chips form electrical connection paths and thus the electrical connection paths are shortened. Due to the shortened electrical connection paths, the semiconductor package is advantageous in processing a large amount of data at a high speed. Nevertheless, since the stacked semiconductor chips are connected by the through-vias, it is difficult to select a specific chip among the stacked semiconductor chips during data processing. To select a specific chip, the stack structure of the semiconductor chips is modified to connect a signal wire and a specific chip, or the arrangement of the through-vias formed in the individual semiconductor chips is modified to form a signal path composed of through-vias connected to only a specific chip. However, in a case in which the stack structure of the chips is modified to connect a separate signal wire and a specific chip, it is structurally difficult to stack chips and configure a package. In a case in which a connection path of through-vias connected to a specific chip is separately provided, the arrangement of through-vias must be differently modified at each semiconductor chip.

SUMMARY

An embodiment of the present invention provides a semiconductor package which is capable of selecting a specific chip using a through-via while stacking the same semiconductor chips.

In one embodiment, a semiconductor package includes: a plurality of semiconductor chips stacked while having the arrangement of chip selection vias; a first connection unit provided between a first semiconductor chip and a second semiconductor chip stacked adjacent to each other, and configured to mutually connect some of the chip selection vias of the first and second semiconductor chips and disconnect the others of the chip selection vias of the first and second semiconductor chips; and a second connection unit provided between the first semiconductor chip and a third semiconductor chip stacked under the first semiconductor chip, and configured to connect chip selection vias of the first and third chip selection vias in inverse order of arrangement.

The semiconductor chips may be the same type of chips.

The semiconductor chips may include the chip selection vias having the same arrangement.

The semiconductor chips may include as many chip selection vias as the stacked semiconductor chips.

The semiconductor package may further include a third connection unit provided between the second semiconductor chip and a fourth semiconductor chip stacked on the second semiconductor chip, and configured to connect chip selection vias of the second and fourth chip selection vias in inverse order of arrangement.

The first connection unit may be provided such that the number of the connected chip selection vias of the first and second semiconductor chips is equal to the number of the disconnected chip selection vias of the first and second semiconductor chips. The first connection unit may include: an insulation layer insulating the first and second semiconductor chips; and connection vias passing through the insulation layer and corresponding to the chip selection vias to be connected. The connection vias may be disposed corresponding to every two chip selection vias to alternately connect and disconnect the chip selection vias. The first connection unit may further include disconnection vias obliquely passing through the insulation layer and mismatched with the chip selection vias to be disconnected.

When the third semiconductor chip is stacked in a flip chip type with respect to the first semiconductor chip and interlayer overlap positions of the chip selection vias are mismatched, the semiconductor package may further include a third connection unit including: first and second insulation layers provided between the third semiconductor chip and the first semiconductor chip; oblique connection vias passing through the first insulation layer and connected to the chip selection vias of the first semiconductor chip; and vertical connection vias passing through the second insulation layer and connected to the oblique connection vias and the chip selection vias of the third semiconductor chips.

In another embodiment, a semiconductor package includes: first, second, third and fourth semiconductor chips stacked while having the arrangement of chip selection vias; and a connection unit provided between a second semiconductor chip and a third semiconductor chip, and configured to mutually connect some of the chip selection vias of the second and third semiconductor chips and disconnect the others of the chip selection vias of the second and third semiconductor chips, wherein the first and second semiconductor chips and the third and fourth semiconductor chips are stacked in a flip chip type.

In another embodiment, a semiconductor package includes: first, second and third semiconductor chips stacked while having the arrangement of chip selection vias; and a first connection unit provided between a second semiconductor chip and a third semiconductor chip, and configured to mutually connect some of the chip selection vias of the second and third semiconductor chips and disconnect the others of the chip selection vias of the second and third semiconductor chips, wherein the first and second semiconductor chips are stacked in a flip chip type.

In another embodiment, a semiconductor package includes: first to third semiconductor chips stacked while having the arrangement of first to fourth chip selection vias; a first connection unit provided between a second semiconductor chip and a third semiconductor chip and configured to mutually connect some of the chip selection vias of the second and third semiconductor chips and disconnect the others of the chip selection vias of the second and third semiconductor chips; and a second connection unit configured to connect a first chip selection via of the first semiconductor chip and a fourth chip selection via of the second semiconductor chip, connect a second chip selection via of the first semiconductor chip and a third chip selection via of the second semiconductor chip, connect a third chip selection via of the first semiconductor chip and a second chip selection via of the second semiconductor chip, and connect a fourth chip selection via of the first semiconductor chip and a first chip selection via of the second semiconductor chip.

In another embodiment, a semiconductor package includes: first, second, third and fourth semiconductor chips each having the arrangement of first to eighth chip selection vias and stacked in a flip chip type; a first connection unit provided between the second semiconductor chip and the third semiconductor chip and configured to mutually connect some of the chip selection vias of the second and third semiconductor chips, which are disposed corresponding to the first to fourth chip selection vias of the first semiconductor chip, which disconnects the others of the chip selection vias of the second and third semiconductor chips, and connects the chip selection vias of the second and third semiconductor chips, which are disposed corresponding to the fifth to eighth chip selection vias of the first semiconductor chip; fifth to eighth semiconductor chips stacked on the fourth semiconductor chip in the same order as the first to fourth semiconductor chips or in inverse order thereof; and a second connection unit provided between the fourth semiconductor chip and the fifth semiconductor chip and configured to connect the chip selection vias of the fourth and fifth semiconductor chips, which are disposed corresponding to the fifth to eighth chip selection vias of the first semiconductor chips, and disconnect the chip selection vias of the fourth and fifth semiconductor chips, which are disposed corresponding to the first to fourth chip selection vias of the first semiconductor chip.

The second connection unit may include: an insulation layer; and cross-connection vias passing through the insulation layer and cross-connecting the chip selection vias of the fourth and fifth semiconductor chips, which are disposed corresponding to the sixth and seventh chip selection vias of the first semiconductor chip.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Embodiments of the present invention provide a construction of a semiconductor package in which semiconductor chips equally manufactured are stacked and wherein a specific semiconductor chip may be selected using through-electrodes or through-vias passing through the semiconductor chips. Since the semiconductor chips are manufactured in the same configuration, the arrangement or shapes of the through-vias passing through the semiconductor chips are also identical. Also, the arrangement or shape of chip selection vias provided in the form of through-vias is also identical, and chip selection logic units integrated into the semiconductor chips in order for chip selection are also equally configured.

In a case in which the semiconductor chips are stacked and electrically connected using through-vias, if layers on which the semiconductor chips are stacked are simply connected using the through-vias, all the stacked semiconductor chips are electrically connected together by a single through-via. Since chip selection signals outputted from the chip selection logic units are also equal, it is difficult to select a specific chip. In embodiments of the present invention, the interlayer connection of the chip selection vias between the layers of the stacked semiconductor chips are modified such that multi signals inputted to the chip selection vias of the lowermost layer are differently applied to the stacked semiconductor chips. For example, even though multi signals "A, B, C, D" are inputted to the chip selection vias of the lowermost semiconductor chip, different signals such as "D, C, B, A" may be inputted to the upper stacked semiconductor chips. At this time, "A, B, C, D" may be "0" meaning a low state or "1" meaning a high state. Accordingly, although the semiconductor package is configured by stacking the same semiconductor chips, a specific semiconductor chip may be selected using multi signals.

Figure 1:
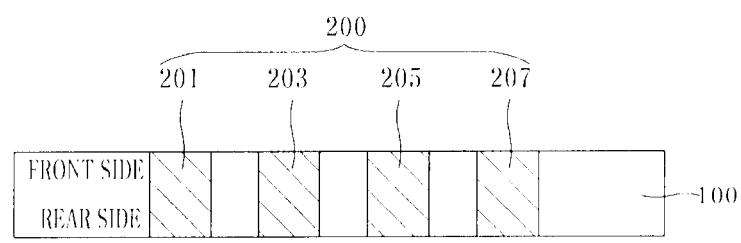
FIG. 1 illustrates a semiconductor chip including chip selection vias according to an embodiment of the present invention.

Referring to FIG. 1, a semiconductor chip 100 according to an embodiment of the present invention has a front side with active regions in which memory banks such as DRAM devices are located. Elements such as transistors may be integrated within the active regions. A chip selection logic unit may also be integrated. In regions, except for the active regions, through-vias 200 may be formed as chip connection terminals. The through-vias 200 may be first to fourth chip selection vias 201, 203, 205 and 207, or may be through-vias for address/power input and data read. The through-vias 200 may be provided with through silicon vias (TSV) passing from the front side to the rear side of the semiconductor chip 200. The chip selection vias 200 (201, 203, 205, 207) for the input of signals related to the chip selection may be sequentially arranged in one direction with respect to the front side of the semiconductor chip 200. The number of the chip selection vias 200 may be determined depending on the number of semiconductor chips 100 to be stacked. For example, the chip selection vias 200 are provided as many as the semiconductor chips 100 to be stacked.

Figure 2A:
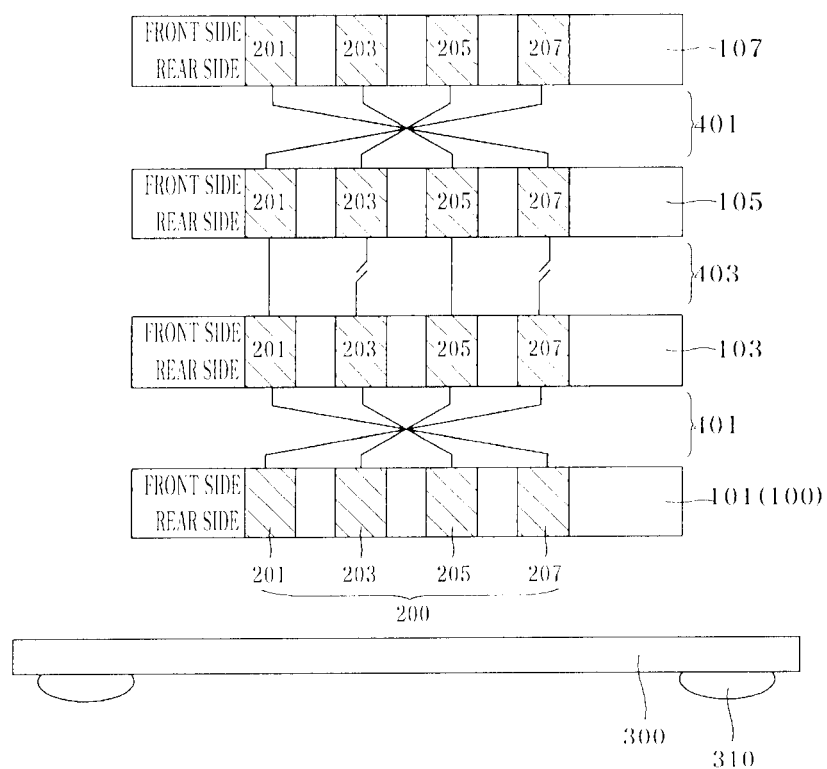
FIGS. 2A to 2B illustrate a semiconductor package according to an embodiment of the present invention.

Referring to FIG. 2A, semiconductor chips 100 (101, 103, 105, 107) each having the arrangement of chip selection vias 200 (201, 203, 205, 207) are stacked. The first semiconductor chip 101 is stacked on a printed circuit board (PCB) 300 with built-in lines and is electrically connected to solder balls 310 through the lines built in the PCB 300. The solder balls 310 are external connection terminals attached to the bottom of the PCB 300.

The chip selection vias 200 may be mutually connected between the layers of the semiconductor chips 100 by a first connection unit 401 and a second connection unit 403. In the embodiment of the present invention, the first connection unit 401 and the second connection unit 403 mutually connect the chip selection vias 200 in different manners. The first connection unit 401 is provided between the first semiconductor chip 101 and the second semiconductor chip 103 adjacently stacked, and connects the chip selection vias 200 of the first semiconductor chip 101 and the chip selection vias 200 of the second semiconductor chip 103 in inverse order of arrangement. For example, the first connection unit 401 is provided to connect the first chip selection via 201 of the first semiconductor chip 101 and the fourth chip selection via 207 of the second semiconductor chip 103, connect the second chip selection via 203 of the first semiconductor chip 101 and the third chip selection via 205 of the second semiconductor chip 103, connect the third chip selection via 205 of the first semiconductor chip 101 and the second chip selection via 203 of the second semiconductor chip 103, and connect the fourth chip selection via 207 of the first semiconductor chip 101 and the first chip selection via 201 of the second semiconductor chip 103. The third chip 105 is stacked on the second chip 103, and the fourth chip 107 is stacked on the third chip 105. The first connection unit 401 is provided between the third semiconductor chip 105 and the fourth semiconductor chip 107, and connects the chip selection vias 200 of the third semiconductor chip 105 and the chip selection vias 200 of the fourth semiconductor chip 107 in inverse order of arrangement.

Multi signals inputted to the chip selection vias 200 of the first semiconductor chip 101 are transferred to other chip selection vias 200 by the first connection unit 401. That is, when the multi signals inputted to the chip selection vias 200 of the first semiconductor chip 101 are "1, 1, 0, 0", the inverted multi signals "0, 0, 1, 1" are inputted to the second semiconductor chip 103. Since the first chip selection via 201 of the first semiconductor chip 101 is connected to the fourth chip selection via 207 of the second semiconductor chip 103, the signal inputted to the first chip selection via 201 of the first semiconductor chip 101 is equally transferred to the fourth chip selection via 207 of the second semiconductor chip 103 by the first connection unit 401. Likewise, the multi signals inputted to the third chip 105 are inversely transferred to the fourth semiconductor chip 107 by the first connection unit 401.

The second connection unit 403 is provided between the second semiconductor chip 103 and the third semiconductor chip 105 adjacently stacked. The second connection unit 403 connects some of the chip selection vias 200 of the second semiconductor chip 103 and the chip selection vias 200 of the third semiconductor chip 105, and disconnects the others of the chip selection vias 200 of the second semiconductor chip 103 and the chip selection vias 200 of the third semiconductor chip 105. In this embodiment, the interlayer connection of the chip selection vias 200 of the semiconductor chips 100 is achieved by the first connection unit 401 and the second connection unit 403. The second connection unit 403 partially makes a connection and partially makes a disconnection, so that signals different from the multi signals inputted to the second chip 103 are inputted to the chip selection vias 200 of the third chip 105.

When the multi signals inputted to the first to fourth chip selection vias 201, 203, 205 and 207 of the second semiconductor chip 103 are "0, 0, 1, 1", the second connection unit 403 connects the first chip selection via 201 of the second semiconductor chip 103 and the first chip selection via 201 of the third semiconductor chip 105, connects the third chip selection via 205 of the second semiconductor chip 103 and the third chip selection via 205 of the third semiconductor chip 105, and disconnects the others. Therefore, the signals "0, 0, 1, 0" are inputted to the chip selection vias 200 of the third semiconductor chip 103 by the second connection unit 403. Since the interlayer connection of the second chip selection via 203 and the fourth chip selection via 207 of the third semiconductor chip 105 is disconnected by the second connection unit 403, the second chip selection via 203 and the fourth chip selection via 207 of the third semiconductor chip 105 may be in a state of "0". Therefore, the different chip selection multi signals are inputted to the third semiconductor chip 105 and the second semiconductor chip 103. Due to the first connection unit 401, the third semiconductor chip 105 and the fourth semiconductor chip 107 have an inversion relationship. Consequently, the signals "0, 1, 0, 0" are inputted to the fourth semiconductor chip 107.

As such, the first connection unit 401 and the second connection unit 403 change the connection order of the chip selection vias 200 between the layers of the stacked semiconductor chips 100, so that the different chip selection multi signals are inputted to the semiconductor chips 100. Using this, a specific one of the semiconductor chips 100 may be selected.

Figure 2B:
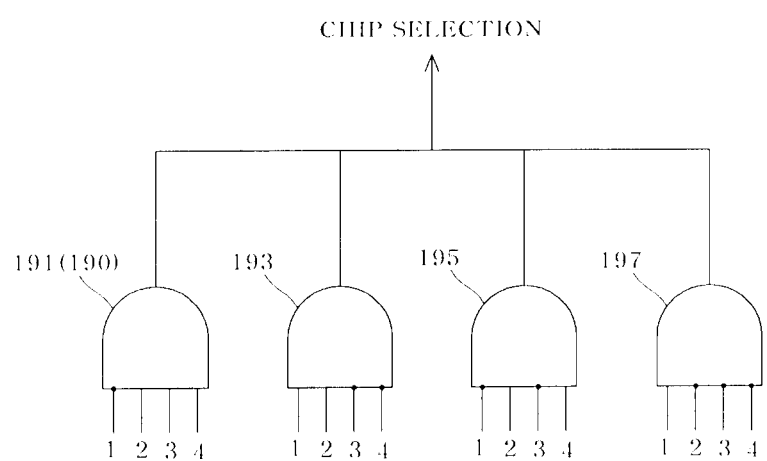

Even though the same chip selection multi signals are inputted to the semiconductor package through the solder ball 310, different chip selection signals may be inputted to the respective stacked semiconductor chips 100. As illustrated in FIG. 2B, even though the semiconductor chips 100 are the same type of chips each including the chip selection logic unit 190, different signals may be inputted to the chip selection logic units 190 of the respective chips 100. That is, even though the first to fourth chip selection logic units 191, 193, 195 and 197 provided in each of the first to fourth semiconductor chips 100 are equally configured, different signal values are inputted to the respective chip section logic units 190. Therefore, a specific chip can be selected by the chip selection vias 200, even though the same semiconductor chips 100 are stacked.

The first and second connection units 401 and 403 may be provided in the form of a redistributed layer (RDL). When considering that the semiconductor chips 100 have the same configuration, depositing and patterning different types of redistributed layers on the semiconductor chips 100 may require unnecessary additional processes. Therefore, in this embodiment, the first connection unit 401 is configured using a flip chip stacking technology, and the second connection unit 403 is configured in a film or spacer form including an insulation layer through which the connection vias pass. Using the flip chip stacking technology, the first connection unit 401 directly connects the chip selection vias 200 by applying a technology for directly connecting the semiconductor chips 100, for example, a connection technology using bumps or solder balls. The second connection unit 403 may be manufactured in a film or sheet form and provided between the chips 100. Thus, slightly cumbersome processes such as deposition or patterning of redistribution layers may be omitted. Therefore, when implementing the connection structure of the second connection unit 403, a wider degree of freedom may be ensured, thereby achieving cost reduction.

Figure 3:
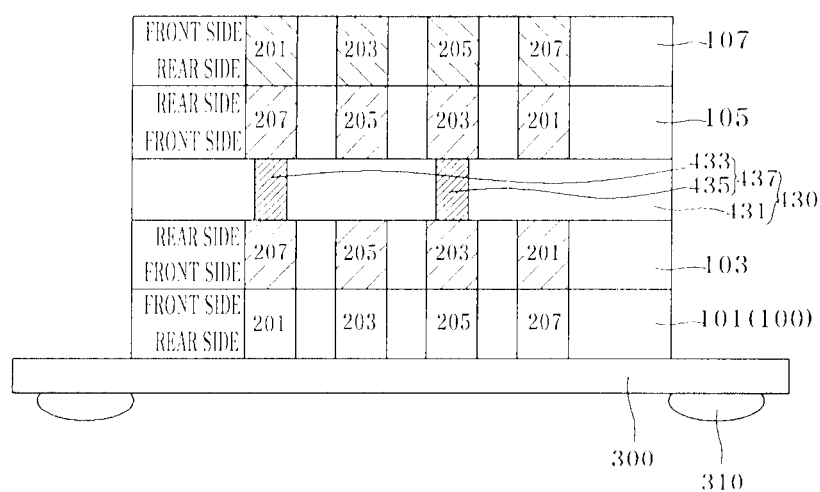
FIG. 3 illustrates one embodiment of a semiconductor package.

Referring to FIG. 3, a semiconductor package according to an embodiment of the present invention includes semiconductor chips 100 (101, 103, 105, 107) each having the arrangement of chip selection vias 200 (201, 203, 205, 207). The semiconductor chips 100 are stacked on a PCB 300 with built-in lines and are electrically connected to solder balls 310 through the lines built in the PCB 300. The solder balls 310 are external connection terminals attached to the bottom of the PCB 300.

The first semiconductor chip 101 and the second semiconductor chip 103 are stacked in a flip chip type such that the front sides thereof face each other. Therefore, the chip selection vias 201, 203, 205 and 207 of the first semiconductor chip 101 and the chip selection vias 201, 203, 205 and 207 of the second semiconductor chip 103 are connected in inverse order of arrangement. Due to such a flip chip stacking, the inverse connection of the chip selection vias 200 can be achieved as proposed in the first connection unit (401 in FIG. 2A). Likewise, the third semiconductor chip 105 and the fourth semiconductor chip 107 are stacked in a flip chip type such that the rear sides thereof face each other. Therefore, the chip selection vias 200 of the third semiconductor chip 105 and the chip selection vias 200 of the fourth semiconductor chip 107 are connected in inverse order of arrangement, as proposed in the first connection unit 401. Meanwhile, the third semiconductor chip 105 may be stacked on the second semiconductor chip 103 in a flip chip type such that the front side of the third semiconductor chip 105 faces the rear side of the second semiconductor chip 103.

A connection unit 430 is provided between the second semiconductor chip 103 and the third semiconductor chip 105, and alternately connects and disconnects the chip selection vias 200 of the second and third semiconductor chips 103 and 105. The connection unit 430 may include an insulation layer 431 insulating the second semiconductor chip 103 and the third semiconductor chip 105. The connection unit 430 may be provided in a sheet or film form including connection vias 437 passing through the insulation layer 431 and corresponding to the chip selection vias 200 to be connected. The connection unit 430 implements the connection relationship of the second connection unit 403 of FIG. 2A. In order to alternately connect and disconnect the chip selection vias 200, the connection vias 437 include a first connection via 433 disposed at a position which mutually connects the fourth chip selection vias 207 of the second and third semiconductor chips 103 and 105, and a second connection via 435 disposed at a position which mutually connects the second chip selection vias 203 of the second and third semiconductor chips 103 and 105.

Data sheet of Table 1 below shows the chip selection using the chip selection vias 200 of the semiconductor chips 100 in the semiconductor package depicted in FIG. 3.

TABLE 1

| | | Binary Expression | | | | | | | Decimal Expression |
|---|---|---|---|---|---|---|---|---|---|
| Fourth Layer | select 1 | 0 | select 2 | 0 | select 3 | 1 | select 4 | 0 | 2 |
| Third Layer | select 1 | 0 | select 2 | 1 | select 3 | 0 | select 4 | 0 | 4 |
| Second Layer | select 1 | 1 | select 2 | 1 | select 3 | 1 | select 4 | 0 | 14 |
| First Layer (selected) | select 1 | 0 | select 2 | 1 | select 3 | 1 | select 4 | 1 | 7 |
| Signal | | 0 | | 1 | | 1 | | 1 | |
| Fourth Layer | select 1 | 0 | select 2 | 0 | select 3 | 1 | select 4 | 0 | 2 |
| Third Layer | select 1 | 0 | select 2 | 1 | select 3 | 0 | select 4 | 0 | 4 |
| Second Layer (selected) | select 1 | 1 | select 2 | 1 | select 3 | 0 | select 4 | 0 | 12 |
| First Layer | select 1 | 0 | select 2 | 0 | select 3 | 1 | select 4 | 1 | 3 |
| Signal | | 0 | | 0 | | 1 | | 1 | |
| Fourth Layer | select 1 | 1 | select 2 | 0 | select 3 | 1 | select 4 | 0 | 10 |
| Third Layer (selected) | select 1 | 0 | select 2 | 1 | select 3 | 0 | select 4 | 1 | 5 |
| Second Layer | select 1 | 1 | select 2 | 1 | select 3 | 0 | select 4 | 1 | 13 |
| First Layer | select 1 | 1 | select 2 | 0 | select 3 | 1 | select 4 | 1 | 11 |
| Signal | | 1 | | 0 | | 1 | | 1 | |
| Fourth Layer (selected) | select 1 | 1 | select 2 | 0 | select 3 | 0 | select 4 | 0 | 8 |
| Third Layer | select 1 | 0 | select 2 | 0 | select 3 | 0 | select 4 | 1 | 1 |
| Second Layer | select 1 | 1 | select 2 | 0 | select 3 | 0 | select 4 | 1 | 9 |
| First Layer | select 1 | 1 | select 2 | 0 | select 3 | 0 | select 4 | 1 | 9 |
| Signal | | 1 | | 0 | | 0 | | 1 | |

From the result of Table 1 above, considering the selection signals (select 1, 2, 3, 4) applied to the first, second, third and fourth chip selection vias 201, 203, 205 and 207, when the multi signals "0, 1, 1, 1" are inputted, the selection signals applied to the first, second, third and fourth chip selection vias 201, 203, 205 and 207 of the first semiconductor chip 101 of the first layer are "0, 1, 1, 1", but different selection signals are applied to the second, third and fourth semiconductor chips 103, 105 and 107 of the second, third and fourth layers. Since the first and third chip selection vias 201 and 205 of the third semiconductor chip 105 of the third layer are disconnected by the insulation layer 431 of the connection unit 430, a value of "0" is given thereto. Accordingly the second and fourth chip selection vias 203 and 207 of the fourth semiconductor chip 107 of the fourth layer are disconnected, a value of "0" is given thereto. Since different signal values are applied to the semiconductor chips 100 of each layer, the first semiconductor chip 101 of the first layer can be selected. Likewise, when different multi signal values of "0, 0, 1, 1", "1, 0, 1, 1", and "1, 0, 0, 1" are given in order to select the semiconductor chips 100 of the second, third and fourth layers, different signal values are applied to the semiconductor chips 100 of each layer. Thus, the semiconductor chips 100 of each layer can be specified and selected.

As shown in data sheet of Table 2 below, the chip selection using the chip selection vias 200 of the semiconductor chips 100 in the semiconductor package of FIG. 3 may be achieved by applying different multi signal values.

a sheet or film form including connection vias 438 passing through the insulation layer 432 and corresponding to the chip selection vias 200 to be connected. The connection vias 438 include a first connection via 434 disposed at a position

TABLE 2

|  | Binary Expression | | | | | | | Decimal Expression |
|---|---|---|---|---|---|---|---|---|
| Fourth Layer | select 1 | 0 | select 2 | 0 | select 3 | 1 | select 4 | 0 | 2 |
| Third Layer | select 1 | 0 | select 2 | 1 | select 3 | 0 | select 4 | 0 | 4 |
| Second Layer | select 1 | 1 | select 2 | 1 | select 3 | 1 | select 4 | 0 | 14 |
| First Layer (selected) | select 1 | 0 | select 2 | 1 | select 3 | 1 | select 4 | 1 | 7 |
| Signal | | 0 | | 1 | | 1 | | 1 | |
| Fourth Layer | select 1 | 0 | select 2 | 0 | select 3 | 0 | select 4 | 0 | 0 |
| Third Layer | select 1 | 0 | select 2 | 0 | select 3 | 0 | select 4 | 0 | 0 |
| Second Layer (selected) | select 1 | 1 | select 2 | 0 | select 3 | 0 | select 4 | 0 | 8 |
| First Layer | select 1 | 0 | select 2 | 0 | select 3 | 0 | select 4 | 1 | 1 |
| Signal | | 0 | | 0 | | 0 | | 1 | |
| Fourth Layer | select 1 | 1 | select 2 | 0 | select 3 | 1 | select 4 | 0 | 10 |
| Third Layer (selected) | select 1 | 0 | select 2 | 1 | select 3 | 0 | select 4 | 1 | 5 |
| Second Layer | select 1 | 1 | select 2 | 1 | select 3 | 0 | select 4 | 1 | 13 |
| First Layer | select 1 | 1 | select 2 | 0 | select 3 | 1 | select 4 | 1 | 11 |
| Signal | | 1 | | 0 | | 1 | | 1 | |
| Fourth Layer (selected | select 1 | 1 | select 2 | 0 | select 3 | 0 | select 4 | 0 | 8 |
| Third Layer | select 1 | 0 | select 2 | 0 | select 3 | 0 | select 4 | 1 | 1 |
| Second Layer | select 1 | 1 | select 2 | 0 | select 3 | 1 | select 4 | 1 | 11 |
| First Layer | select 1 | 1 | select 2 | 1 | select 3 | 0 | select 4 | 1 | 13 |
| Signal | | 1 | | 1 | | 0 | | 1 | |

Figure 4:
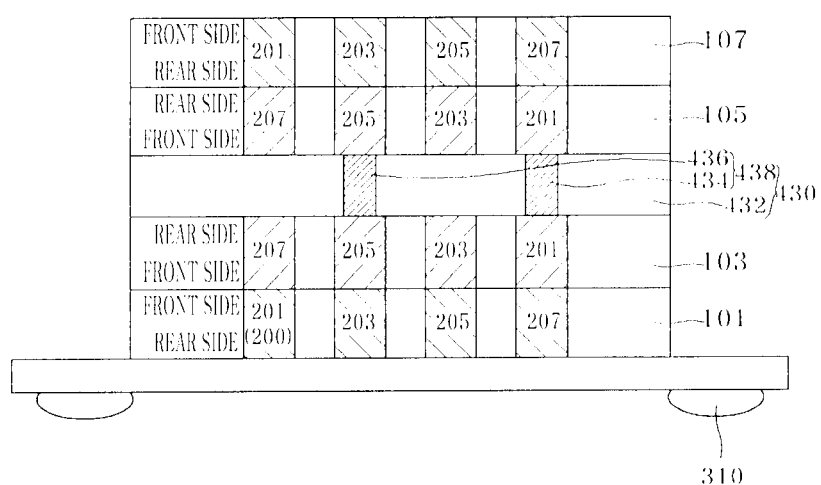
FIG. 4 illustrates a structure in which the connection vias of the embodiment depicted in FIG. 3. are rearranged.

FIG. 4 illustrates a structure in which the positions of the connection vias 437 of the connection unit 430 in the semiconductor package of FIG. 3 are changed. A connection unit 430 is provided between the second semiconductor chip 103 and the third semiconductor chip 105, and alternately connects and disconnects the chip selection vias 200 of the second and third semiconductor chips 103 and 105. The connection unit 430 may include an insulation layer 432 insulating the second semiconductor chip 103 and the third semiconductor chip 105. The connection unit 430 may be provided in which mutually connects the first chip selection vias 201 of the second and third semiconductor chips 103 and 105, and a second connection via 436 disposed at a position which mutually connects the third chip selection vias 205 of the second and third semiconductor chips 103 and 105.

Data sheet of Table 3 below shows the chip selection using the chip selection vias 200 of the semiconductor chips 100 of the lowermost layer in the semiconductor package depicted in FIG. 4.

TABLE 3

|  | Binary Expression | | | | | | | Decimal Expression |
|---|---|---|---|---|---|---|---|---|
| Fourth Layer | select 1 | 0 | select 2 | 1 | select 3 | 0 | select 4 | 1 | 5 |
| Third Layer | select 1 | 1 | select 2 | 0 | select 3 | 1 | select 4 | 0 | 10 |
| Second Layer | select 1 | 1 | select 2 | 1 | select 3 | 1 | select 4 | 0 | 14 |
| First Layer (selected) | select 1 | 0 | select 2 | 1 | select 3 | 1 | select 4 | 1 | 7 |
| Signal | | 0 | | 1 | | 1 | | 1 | |
| Fourth Layer | select 1 | 0 | select 2 | 0 | select 3 | 0 | select 4 | 0 | 0 |
| Third Layer | select 1 | 0 | select 2 | 0 | select 3 | 0 | select 4 | 0 | 0 |
| Second Layer (selected) | select 1 | 0 | select 2 | 1 | select 3 | 0 | select 4 | 0 | 4 |
| First Layer | select 1 | 0 | select 2 | 0 | select 3 | 1 | select 4 | 0 | 2 |
| Signal | | 0 | | 0 | | 1 | | 0 | |
| Fourth Layer | select 1 | 0 | select 2 | 0 | select 3 | 0 | select 4 | 1 | 1 |
| Third Layer (selected) | select 1 | 1 | select 2 | 0 | select 3 | 0 | select 4 | 0 | 8 |
| Second Layer | select 1 | 1 | select 2 | 1 | select 3 | 0 | select 4 | 1 | 13 |
| First Layer | select 1 | 1 | select 2 | 0 | select 3 | 1 | select 4 | 1 | 11 |
| Signal | | 1 | | 0 | | 1 | | 1 | |
| Fourth Layer (selected | select 1 | 0 | select 2 | 1 | select 3 | 0 | select 4 | 0 | 4 |
| Third Layer | select 1 | 0 | select 2 | 0 | select 3 | 1 | select 4 | 0 | 2 |
| Second Layer | select 1 | 0 | select 2 | 1 | select 3 | 1 | select 4 | 1 | 7 |
| First Layer | select 1 | 1 | select 2 | 1 | select 3 | 1 | select 4 | 0 | 14 |
| Signal | | 1 | | 1 | | 1 | | 0 | |

From the result of Table 3 above, the semiconductor chips 101, 103, 105 and 107 of the respective layers can be selected by applying different selection signals (select 1, 2, 3, 4) to the first, second, third and fourth chip selection vias 201, 203, 205 and 207 of the first semiconductor chip 101 of the lowermost layer.

Figure 5:
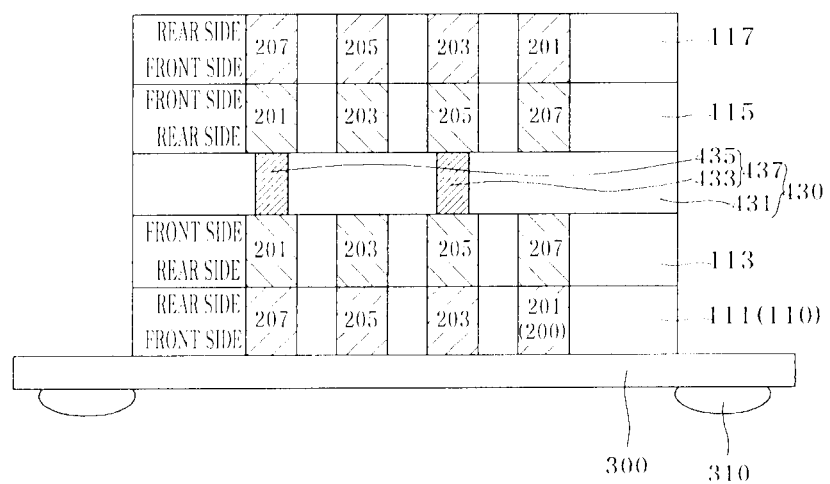
FIG. 5 illustrates a semiconductor package in which the front and rear sides of some of semiconductor chips depicted in FIG. 3 are upside down.

FIG. 5 illustrates a semiconductor package in which the front and rear sides of the semiconductor chips 100 in the semiconductor package of FIG. 3 are upside down. A first semiconductor chip 111 is stacked on a PCB 300 in a flip chip type such that the front side thereof faces the surface of the PCB 300. Accordingly, the first semiconductor chip 111 and the second semiconductor chip 113 are stacked in a flip chip type such that the rear sides thereof face each other. Chip selection vias 201, 203, 205 and 207 of the first semiconductor chip 111 and chip selection vias 201, 203, 205 and 207 of the second semiconductor chip 113 are mutually connected in inverse order of arrangement. Due to such a flip chip stacking, the inverse connection of the chip selection vias 200 can be achieved as proposed in the first connection unit (401 in FIG. 2A). Likewise, the third semiconductor chip 115 and the fourth semiconductor chip 117 are stacked in a flip chip type such that the front sides thereof face each other. Therefore, the chip selection vias 200 of the third semiconductor chip 115 and the chip selection vias 200 of the fourth semiconductor chip 117 are connected in inverse order of arrangement, as proposed in the first connection unit 401. Meanwhile, the third semiconductor chip 115 may be stacked on the second semiconductor chip 113 in a flip chip type such that the rear side of the third semiconductor chip 115 faces the front side of the second semiconductor chip 113.

A connection unit 430 may include an insulation layer 431 insulating the second semiconductor chip 113 and the third semiconductor chip 115. The connection unit 430 may be provided in a sheet or film form including connection vias 437 passing through the insulation layer 431 and corresponding to the chip selection vias 200 to be connected. The connection unit 430 includes a first connection via 433 disposed at a position which mutually connects the third chip selection vias 205 of the second and third semiconductor chips 113 and 115, and a second connection via 435 disposed at a position which mutually connects the first chip selection vias 201 of the second and third semiconductor chips 113 and 115. At this time, although the first and second connection vias 433 and 435 are alternately provided, the positions of the first connection via 433 and the second connection via 435 may be changed to connect or disconnect the second or fourth chip selection vias 203 and 207.

Data sheet of Table 4 below shows the chip selection using the chip selection vias 200 of the semiconductor chips 100 in the semiconductor package of FIG. 5. Due to the insulation layer 431, the signal transfer to the second and fourth chip selection vias 203 and 207 of the third semiconductor chip 115 of the third layer is interrupted. Thus, values of "0" are given to the second and fourth chip selection vias 203 and 207 of the third semiconductor chip 115. Therefore the signal transfer to the third and first chip selection vias 205 and 201 of the fourth semiconductor chip 117 is also interrupted, values of "0" are given thereto.

TABLE 4

| | | | | | | | | | Decimal Expression |
|---|---|---|---|---|---|---|---|---|---|
| | | | Binary Expression | | | | | | |
| Fourth Layer | select 1 | 0 | select 2 | 1 | select 3 | 0 | select 4 | 0 | 4 |
| Third Layer | select 1 | 0 | select 2 | 0 | select 3 | 1 | select 4 | 0 | 2 |
| Second Layer | select 1 | 0 | select 2 | 0 | select 3 | 1 | select 4 | 1 | 3 |
| First Layer (selected) | select 1 | 1 | select 2 | 1 | select 3 | 0 | select 4 | 0 | 12 |
| Signal | | 0 | | 0 | | 1 | | 1 | |
| Fourth Layer | select 1 | 0 | select 2 | 0 | select 3 | 0 | select 4 | 1 | 1 |
| Third Layer | select 1 | 1 | select 2 | 0 | select 3 | 0 | select 4 | 0 | 8 |
| Second Layer (selected) | select 1 | 1 | select 2 | 1 | select 3 | 0 | select 4 | 1 | 13 |
| First Layer | select 1 | 1 | select 2 | 0 | select 3 | 1 | select 4 | 1 | 11 |
| Signal | | 1 | | 1 | | 0 | | 1 | |
| Fourth Layer | select 1 | 0 | select 2 | 0 | select 3 | 0 | select 4 | 1 | 1 |
| Third Layer (selected) | select 1 | 1 | select 2 | 0 | select 3 | 0 | select 4 | 0 | 8 |
| Second Layer | select 1 | 1 | select 2 | 0 | select 3 | 0 | select 4 | 1 | 9 |
| First Layer | select 1 | 1 | select 2 | 0 | select 3 | 0 | select 4 | 1 | 9 |
| Signal | | 1 | | 0 | | 0 | | 1 | |
| Fourth Layer (selected | select 1 | 0 | select 2 | 1 | select 3 | 0 | select 4 | 0 | 4 |
| Third Layer | select 1 | 0 | select 2 | 0 | select 3 | 1 | select 4 | 0 | 2 |
| Second Layer | select 1 | 0 | select 2 | 1 | select 3 | 1 | select 4 | 0 | 6 |
| First Layer | select 1 | 0 | select 2 | 1 | select 3 | 1 | select 4 | 0 | 6 |
| Signal | | 0 | | 1 | | 1 | | 0 | |

From the result of Table 4 above, the semiconductor chips 111, 113, 115 and 117 of the respective layers may be selected by applying different selection signals (select 1, 2, 3, 4) to the first, second, third and fourth chip selection vias 201, 203, 205 and 207 of the first semiconductor chip 111 of the lowermost layer.

Figure 6:
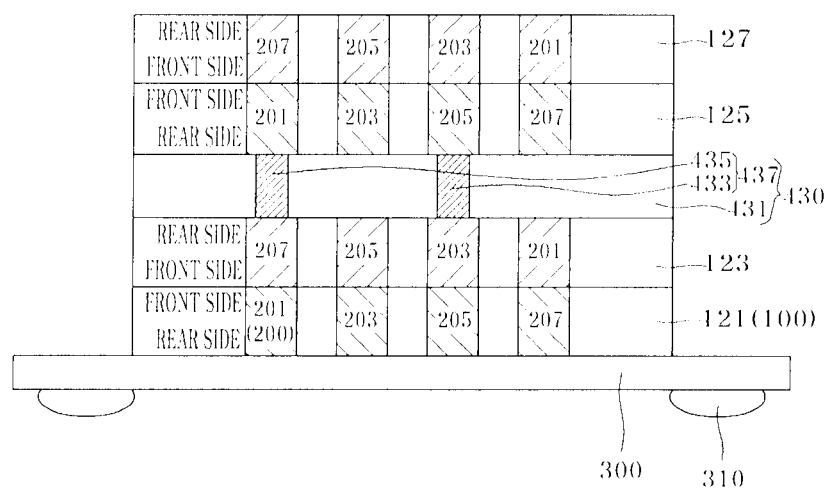
FIG. 6 ilustrates a semiconductor package in which the rear side of the first semiconductor chip of the semiconductor package faces a printed circuit board.

FIG. 6 illustrates a semiconductor package in which the rear side of the first semiconductor chip 121 in the semiconductor package of FIG. 5 faces the PCB 300. The first and second semiconductor chips 121 and 123 are stacked in a flip chip type such that the front sides thereof face each other. Also, the third semiconductor chip 125 is stacked such that the rear side thereof faces the rear side of the second semiconductor chip 123. The fourth semiconductor chip 127 is stacked on the third semiconductor chip 125 in a flip chip type.

A connection unit 430 may include an insulation layer 431 insulating the second semiconductor chip 123 and the third semiconductor chip 125. The connection unit 430 may be provided in a sheet or film form including connection vias 437 passing through the insulation layer 431 and corresponding to the chip selection vias 200 to be connected. The connection unit 430 includes a first connection via 433 disposed at a position which mutually connects the second chip selection via 203 of the second semiconductor chip 123 and the third chip selection via 205 of the third semiconductor chip 125, and a second connection via 435 disposed at a position which mutually connects the fourth chip selection vias 207 of the second semiconductor chip 123 and the first chip selection via 201 of the third semiconductor chip 125.

Data sheet of Table 5 below shows the chip selection using the chip selection vias 200 of the semiconductor chips 100 in the semiconductor package of FIG. 6. Due to the insulation layer 431, the signal transfer to the second and fourth chip selection vias 203 and 207 of the third semiconductor chip 125 of the third layer is interrupted. Thus, values of "0" are given to the second and fourth chip selection vias 203 and 207 of the third semiconductor chip 125. Therefore the signal transfer to the third and first chip selection vias 205 and 201 of the fourth semiconductor chip 127 is also interrupted, values of "0" are given thereto.

relationship of the first connection unit 401 of FIG. 2A. Unlike the case of FIG. 3 in which the second semiconductor chip 103 is directly stacked on the first semiconductor chip 101 in a flip chip type, the first connection unit 410 is provided between the first semiconductor chip 101 and the second semiconductor chip 103 in an interpose film or sheet form. The first connection unit 410 may include an insulation layer 411 insulating the first and second semiconductor chips 101 and 103, and connection vias 413 passing through the insulation layer 411 to mutually connecting the corresponding chip selection vias 200.

A second connection unit 430 is provided between the second semiconductor chip 103 and the third semiconductor chip 105 to alternately connect and disconnect chip selection vias 200 of the second semiconductor chip 103 and the third semiconductor chip 105. The second connection unit 430 may be provided with a sheet or film form including an insulation layer 431 insulating the second semiconductor chip 103 and the third semiconductor chip 105, and connection vias 437 passing through the insulation layer 431 and

TABLE 5

| | Binary Expression | | | | | | | | Decimal Expression |
|---|---|---|---|---|---|---|---|---|---|
| Fourth Layer | select 1 | 0 | select 2 | 0 | select 3 | 0 | select 4 | 0 | 0 |
| Third Layer | select 1 | 0 | select 2 | 0 | select 3 | 0 | select 4 | 0 | 0 |
| Second Layer | select 1 | 1 | select 2 | 0 | select 3 | 0 | select 4 | 0 | 8 |
| First Layer (selected) | select 1 | 0 | select 2 | 0 | select 3 | 0 | select 4 | 1 | 1 |
| Signal | | 0 | | 0 | | 0 | | 1 | |
| Fourth Layer | select 1 | 0 | select 2 | 0 | select 3 | 0 | select 4 | 0 | 0 |
| Third Layer | select 1 | 0 | select 2 | 0 | select 3 | 0 | select 4 | 0 | 0 |
| Second Layer (selected) | select 1 | 0 | select 2 | 0 | select 3 | 1 | select 4 | 0 | 2 |
| First Layer | select 1 | 0 | select 2 | 1 | select 3 | 0 | select 4 | 0 | 4 |
| Signal | | 0 | | 1 | | 0 | | 0 | |
| Fourth Layer | select 1 | 0 | select 2 | 1 | select 3 | 0 | select 4 | 0 | 4 |
| Third Layer (selected) | select 1 | 0 | select 2 | 0 | select 3 | 1 | select 4 | 0 | 2 |
| Second Layer | select 1 | 1 | select 2 | 1 | select 3 | 1 | select 4 | 0 | 14 |
| First Layer | select 1 | 0 | select 2 | 1 | select 3 | 1 | select 4 | 1 | 7 |
| Signal | | 0 | | 1 | | 1 | | 1 | |
| Fourth Layer (selected) | select 1 | 0 | select 2 | 1 | select 3 | 0 | select 4 | 1 | 5 |
| Third Layer | select 1 | 1 | select 2 | 0 | select 3 | 1 | select 4 | 0 | 10 |
| Second Layer | select 1 | 1 | select 2 | 1 | select 3 | 0 | select 4 | 1 | 13 |
| First Layer | select 1 | 1 | select 2 | 0 | select 3 | 1 | select 4 | 1 | 11 |
| Signal | | 1 | | 0 | | 1 | | 1 | |

From the result of Table 5 above, the semiconductor chips 121, 123, 125 and 127 of the respective layers may be selected by applying different selection signals (select 1, 2, 3, 4) to the first, second, third and fourth chip selection vias 201, 203, 205 and 207 of the first semiconductor chip 121 of the lowermost layer.

Figure 7:
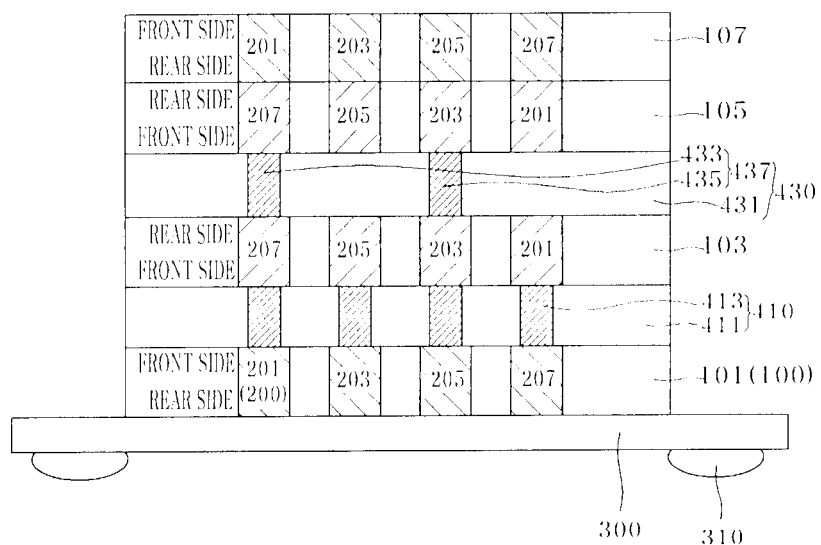
FIG. 7 illustrates an embodiment of a semiconductor package further comprising a differing arrangement of connection units.

FIG. 7 illustrates a structure in which a first connection unit 410 is provided between the first semiconductor chip 101 and the second semiconductor chip 103 in the semiconductor package of FIG. 3. Although the first semiconductor chip 101 and the second semiconductor chip 103 are stacked in a flip chip type such that the front sides thereof face each other, as illustrated in FIG. 3, the first connection unit 410 is provided in a sheet or film form between the first semiconductor chip 101 and the second semiconductor chip 103 such that chip selection vias 201, 203, 205 and 207 of the first semiconductor chip 101 and chip selection vias 201, 203, 205 and 207 of the second semiconductor chip 103 are mutually connected in inverse order of arrangement. The first connection unit 410 is provided as one example which implements the connection corresponding to the chip selection vias 200 to be connected. The second connection unit 430 implements the connection relationship of the second connection unit 403 of FIG. 2A. In order to alternately connect the chip selection vias 200, the connection vias 437 include a first connection via 433 provided at a position which mutually connects the fourth chip selection vias 207 of the second and third semiconductor chips 103 and 105, and a second connection via 435 provided at a position which mutually connects the second chip selection vias 203.

The first connection unit 410 and the second connection unit 430 are separately manufactured in a film or sheet form and provided in a spacer form between the semiconductor chips 100 during the stacking of the semiconductor chips 100, thereby implementing the interlayer connection structure of the chip selection vias 200. Therefore, compared with the process of depositing and patterning the redistributed layers, a simpler connection structure can be implemented and, the manufacturing cost can be reduced.

Figure 8:
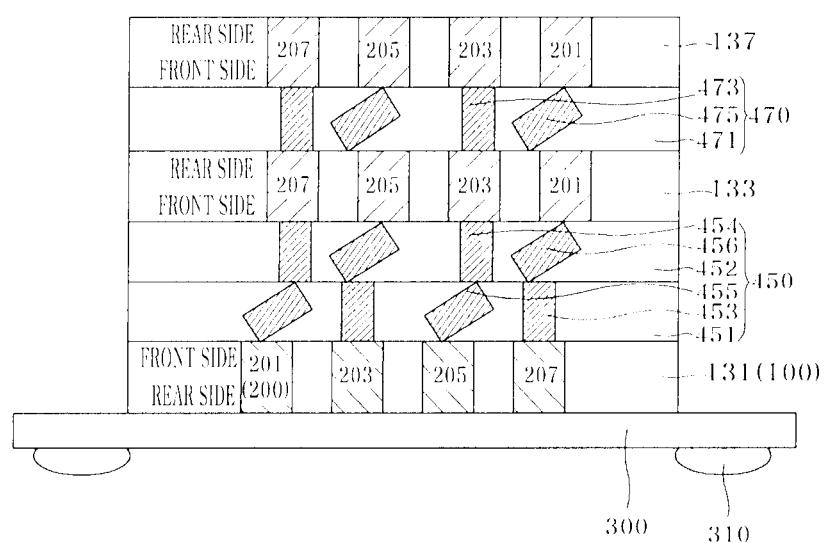
FIG. 8 illustrates an embodiment of a semiconductor package comprising three semiconductor chips.

FIG. 8 illustrates a semiconductor package in which the fourth semiconductor chip 107 is excluded in the semiconductor package structure of FIG. 7 and thus three semiconductor chips 100 are stacked. The semiconductor packages of FIGS. 3 to 7 have the structure in which four semiconductor chips 100 are stacked. Meanwhile, the semiconductor package of FIG. 8 has the structure in which the uppermost layer, that is, the fourth semiconductor chip 107, is excluded and thus three semiconductor chips are stacked. In such a three-layer semiconductor package structure, chip selection using multi signals can be achieved through chip selection vias 200. In this case, at least four chip selection vias 200 may be provided for applying the multi signals.

Referring to FIG. 8, although a first semiconductor chip 131 and a second semiconductor chip 133 are stacked in a flip chip type such that the front sides thereof face each other, a first connection unit 450 may be provided in a sheet or film form such that chip selection vias 201, 203, 205 and 207 of the first semiconductor chip 131 and chip selection vias 201, 203, 205 and 207 of the second semiconductor chip 133 are mutually connected in inverse order of arrangement. In this case, the chip selection vias 201, 203, 205 and 207 of the first semiconductor chip 131 and the chip selection vias 201, 203, 205 and 207 of the second semiconductor chip 133 are inversely arranged, but, in some cases, their positions may not be directly vertically overlapped but may be mismatched when viewed in a vertical direction. When the overlap positions are mismatched, a first connection unit 450 may be provided in a multi-layer to mutually connect the chip selection vias 200 located at the mismatched positions.

The first connection unit 450 is provided between the first semiconductor chip 131 and the second semiconductor chip 133 in an interpose film or sheet. The first connection unit 450 may include: a first insulation layer 451 and a second insulation layer 452; first vertical connection vias 453 and first oblique connection vias 455 passing through the first insulation layer 451 and connected to the chip selection vias 200 of the first semiconductor chip 131; and second vertical connection vias 454 and second oblique connection vias 456 passing through the second insulation layer 452 and connected to the first oblique connection vias 455 and the chip selection vias 200 of the second semiconductor chip 133. The arrangements of the vertical connection vias 453 and 454 and the oblique connection vias 455 and 456 in the first insulation layer 451 and the second insulation layer 452 may be substantially equal to each other. By sequentially stacking the first insulation layer 451 and the second insulation layer 452, the vertical connection vias 453 and 454 and the oblique connection vias 455 and 456 are mutually connected. Thus, the first chip selection via 201 of the first semiconductor chip 131 and the fourth chip selection via 207 of the second semiconductor chip 133, which are mismatched at the overlap position thereof, may be mutually connected. As such, the first connection unit 450 may be provided by combining the stacking of films or sheets and may mutually connect the chip selection vias 200 more simply, even though the chip selection vias 200 are overlapped and stacked in a mismatched manner when viewed in a vertical direction.

A second connection unit 470 is provided between the second semiconductor chip 133 and the third semiconductor chip 135 and alternately connects and disconnects the chip selection vias 200 of the second and third semiconductor chips 133 and 135. The second connection unit 470 includes a film- or sheet-type insulation layer 471 for insulating the semiconductor chips and the connection vias. Also, the second connection unit 450 may include vertical connection vias 473 passing through the insulation layer 471 and corresponding to the chip selection vias 200 to be connected, and oblique connection vias 475. The oblique connection vias 475 disconnect the upper and lower chip selection vias 200 due to their oblique shape. That is, the oblique connection vias 475 serve as disconnection vias. The oblique connection vias 475 may be used as connection vias which mutually connect the upper and lower chip selection vias 200 when they are mismatched at their overlap positions. In this case, the vertical connection vias serve as disconnection vias.

When the four semiconductor chips 100 are stacked, the semiconductor package according to the embodiment of the present invention can select the stacked individual semiconductor chips by using the chip selection vias 200 and the multi signals. Therefore, the stacked semiconductor chips 100 may be configured with the substantially identical chips, and the chip selection vias need not be differently formed at each semiconductor chip. Meanwhile, although the semiconductor package structure in which the four semiconductor chips are stacked is provided in the embodiment of the present invention, the invention can also be applied to a case in which more semiconductor chips are stacked. For example, a semiconductor package structure in which eight semiconductor chips 100 are stacked is illustrated in FIG. 9.

Figure 9:
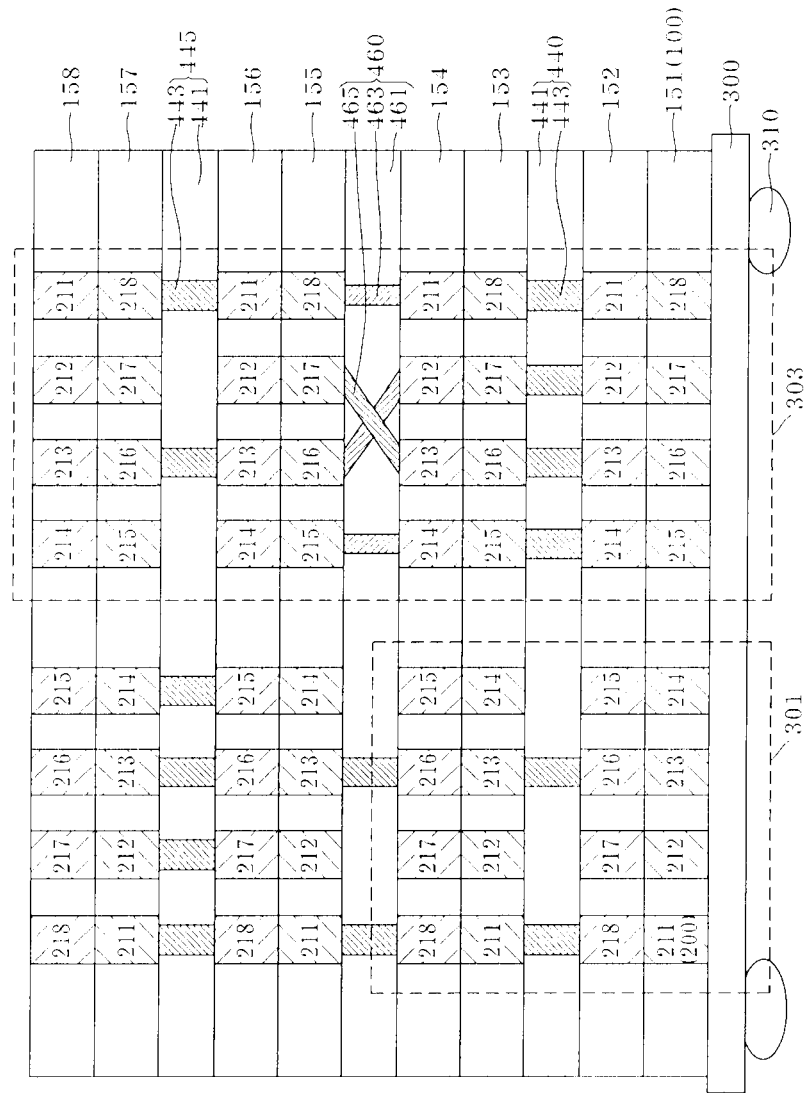
FIG. 9 illustrates an embodiment of a semiconductor package comprising eight chips stacked on a printed circuit board.

Referring to FIG. 9, semiconductor chips 100 (151, 152, 153, 154, 155, 156, 157, 158) having the arrangement of first to eighth chip selection vias 200 (211, 212, 213, 214, 215, 216, 217, 218) are stacked on a PCB 300, and external connection terminals such as solder balls 310 are attached to the PCB 300.

Among the semiconductor chips, the first and second semiconductor chips 151 and 152, the third and fourth semiconductor chips 153 and 154, the fifth and sixth semiconductor chips 155 and 156, and the seventh and eighth semiconductor chips 157 and 158 are mutually stacked in a flip chip type, respectively. Accordingly, chip selection vias of the first and second semiconductor chips 151 and 152, the third and fourth semiconductor chips 153 and 154, the fifth and sixth semiconductor chips 155 and 156, and the seventh and eighth semiconductor chips 157 and 158 can be directly connected without separate interpose boards or redistribution layers. In this case, the second and third semiconductor chips 152 and 153, the fourth and fifth semiconductor chips 154 and 155, and the sixth and seventh semiconductor chips 156 and 157 may be stacked in a flip chip type, or may be stacked in inverse order of arrangement.

The 8-layer semiconductor package may be divided into a first block 301 in which first to fourth chip selection vias 211 to 214 are disposed in a sequential direction of the lowermost layer, i.e., the first semiconductor chip 151, and a second block 303 in which fifth to eighth chip selection vias 215 to 218 are disposed. The connection structures between the stacked semiconductor chips 100 may be differently applied according to the blocks. That is, a first connection unit 440 and a second connection unit 460 for interlayer connection between the semiconductor chips 100 are configured to have different connection structures in the first block 301 and the second block 303.

For example, the first connection unit 440 is provided between the second semiconductor chip 152 and the third semiconductor chip 153. The first connection unit 440 is configured to alternately connect and disconnect the chip selection vias 200 of the second and third semiconductor chips 152 and 153, which are stacked on the first block disposed corresponding to the first to fourth vias 211, 212, 213 and 214 of the first semiconductor chip 152, and to connect the chip selection vias 200 of the second and third semiconductor chips 152 and 153, which are stacked on the second block 303 disposed corresponding to the fifth to eighth vias 215, 216, 217 and 218 of the first semiconductor chip 151.

The first connection unit 440 may include an insulation layer 441 and connection vias 443 passing through the insulation layer 441 to mutually connect the eighth chip selection via 218 of the second semiconductor chip 152 and the first chip selection via 211 of the third semiconductor chip 153, to mutually connect the sixth chip selection via 216 of the second semiconductor chip 152 and the third chip selection via 213 of the third semiconductor chip 153, and to mutually connect the fourth to first chip selection vias 214, 213, 212 and 211 of the second semiconductor chip 152 and the fifth to eighth chip selection vias 215, 216, 217 and 218 of the third semiconductor chip 153. The downward connection of the second and fourth chip selection vias 212 and 214 of the third semiconductor chip 153 is disconnected by the insulation layer 441.

The stack structure and connection structure of the first to fourth semiconductor chips 151, 152, 153 and 154 in the first block 301 may be substantially identical to those of the semiconductor package of FIG. 6. As described above with reference to FIG. 6, the first to fourth semiconductor chips 151, 152, 153 and 154 may be individually selected by applying multi signals to the first to fourth chip selection vias 211, 212, 213 and 214 of the first semiconductor chip 151. Accordingly, the stack structure and connection structure of the first to fourth semiconductor chips 151, 152, 153 and 154 in the first block 301 may have the modified structure of the 4-layer semiconductor package described above with reference to FIGS. 3 to 8.

The fifth to eighth chips 155, 156, 157 and 158 may be stacked in the same manner as the first to fourth semiconductor chips 151, 152, 153 and 154. At this time, the fifth semiconductor chip 155 may be stacked in a flip chip type in inverse order with respect to the underlying fourth semiconductor chip 154. In some cases, the fourth and fifth semiconductor chips 154 and 155 may be stacked such that the front side of the fourth semiconductor chip 154 faces (or is opposite to) the rear side of the fifth semiconductor chip 155, instead of the flip chip type configuration. Also, the interlayer connection structure of the fifth to eighth semiconductor chips 155, 156, 157 and 158 is substantially identical to those of the first to fourth semiconductor chips 151, 152, 153 and 154, but the structure in the first block 301 and the second block 303 has an inverse relationship to that of the first to fourth semiconductor chips 151, 152, 153 and 154. That is, a second connection unit 445 provided between the sixth semiconductor chip 156 and the seventh semiconductor chip 157 may be substantially identical to the first connection unit 440, and may include an insulation layer 441 and connection vias 443 provided such that the structure in the first block 301 and the second block 303 has an inverse relationship to that of the first connection unit 440. Nevertheless, the stack and connection structure of the fifth to eighth semiconductor chips 155, 156, 157 and 158 in the second block 303 may have the modified structure of the 4-layer package structure described above with reference to FIGS. 3 to 8.

The chip selection vias 200 of the first to fourth semiconductor chips 151, 152, 153 and 154 in the second block 303 are directly mutually connected to configure a simple signal transfer path. Therefore, when the multi signals are applied through the fifth to eighth chip selection vias 215, 216, 217 and 218 of the first semiconductor chip 151 of the lowermost layer, the multi signals are transferred to the fifth to eighth chip selection vias 215, 216, 217 and 218 of the fifth semiconductor chip 155. Since the mutual stack and connection structure of the fifth to eighth semiconductor chips 155, 156, 157 and 158 in the second block 303 are substantially identical to the 4-layer package structures described above with reference to FIGS. 3 to 8, the fifth to eighth semiconductor chips 155, 156, 157 and 158 receive different signals by inputting the multi signals to the fifth to eighth chip selection vias 215, 216, 217 and 218 of the fifth semiconductor chip 155. Hence, a specific one of the fifth to eighth semiconductor chips can be selected.

When the multi signals "A, B, C, D" each of which is "0" or "1" are applied to the first to fourth chip selection vias 211, 212, 213 and 214 of the first semiconductor chip 151 disposed at the lowermost layer in the first block 301, different signals are applied to the first to fourth semiconductor chips 151, 152, 153 and 154, thereby achieving the chip selection. Also, when the multi signals "E, F, G, H" each of which is "0" or "1" are applied to the fifth to eighth chip selection vias 215, 216, 217 and 218 of the first semiconductor chip 151 disposed in the second block 303, different signals are applied to the fifth to eighth semiconductor chips 155, 156, 157 and 158, thereby achieving the chip selection.

At this time, when the first and fifth chip selection vias 211 and 215, the second and sixth chip selection vias 212 and 216, the third and seventh chip selection vias 213 and 217, and the fourth and eighth chip selection vias 214 and 218 are common such that the values A-E, B-F, C-G and D-H are commonly applied, the chip selection of the first to eighth semiconductor chips can be achieved by applying the multi signals "A, B, C, D". In this case, in order not to overlap the chip selection signals between the first to fifth semiconductor chips and the fifth to eighth semiconductor chips, the transferred signal values may be changed by partially crossing the signal transfer to the fifth semiconductor chip 155 between the fourth semiconductor chip 154 and the fifth semiconductor chip 155. To this end, a third connection unit 460 is provided between the fourth semiconductor chip 154 and the fifth semiconductor chip 155.

The third connection unit 460 includes an insulation layer 461 insulating the chip selection vias of the fourth and fifth semiconductor chips 154 and 155 disposed in the first block 301, and connection vias 463 and 465. At this time, the connection vias 463 and 465 may include cross-connection vias 465 cross-connecting the chip selection vias of the fourth and fifth semiconductor chips 154 and 155 disposed corresponding to the sixth and seventh chip selection chips 216 and 217 of the first semiconductor chip 151, and vertical connection vias 463 directly connecting the chip selection vias of the fourth and fifth semiconductor chips 154 and 155 disposed corresponding to the fifth and eighth chip selection chips 215 and 218 of the first semiconductor chip 151. The cross-connection vias 465 are crossed to connect the third chip selection via 213 of the fourth semiconductor chip 154 and the seventh chip selection via 217 of the fifth semiconductor chip 155. That is, the cross-connection vias 465 are provided to mutually connect the two chip selection vias 213 and 217 without being mutually overlapped. Due to the third connection unit 460, the chip selection signals may be applied to the first to fourth semiconductor chips 151 to 154 and the fifth to eighth semiconductor chips 155 to 158, without being overlapped.

Figure 10:
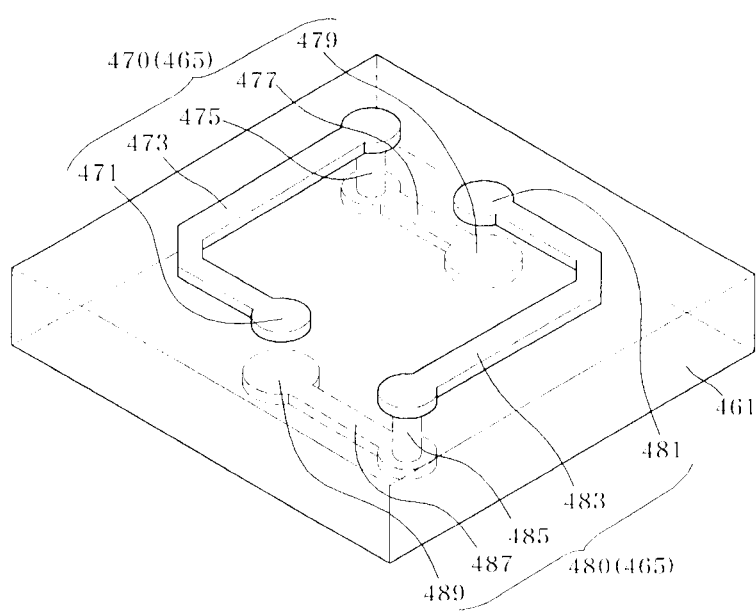
FIG. 10 illustrates an embodiment of a semiconductor package comprising connection portions.

As illustrated in FIG. 10, the cross-connection vias 465 of the third connection unit 460 may include a first cross-connection via 470 and a second cross-connection via 480 passing through the insulation layer 461 and crossed with each other. The first cross-connection via 470 and the second cross-connection via 480 are crossed to connect the third chip connection via 213 of the fourth semiconductor chip 154 and the seventh chip selection via 217 of the fifth semiconductor chip 155, or to connect the second chip selection via 212 of the fourth semiconductor chip 154 and the sixth chip selection via 216 of the fifth semiconductor chip 155.

For example, the first cross-connection via 470 may include a first connection portion 471 disposed at an overlap position on the insulation layer 461 corresponding to the sixth chip selection via 216 of the fifth semiconductor chip 155, a first tracer portion 473 extending outward from the first connection portion 471, a first penetration portion 475 connected to the other end of the first tracer portion 473, a second connection portion 479 disposed at a position overlapped with the second chip selection via 212 of the fourth semiconductor chip 154, and a second tracer portion 477 disposed on the opposite surface of the insulation layer 461 to connect the first penetration portion 475 and the second connection portion 479. Likewise, the second cross-connection via 480 may include a third connection portion 481 disposed at an overlap position on the insulation layer 461 corresponding to the seventh chip selection via 217 of the fifth semiconductor chip 155, a third tracer portion 483 extending outward from the third connection portion 481, a second penetration portion 485 connected to the other end of the third tracer portion 483, a fourth connection portion 489 disposed at a position overlapped with the third chip selection via 213 of the fourth semiconductor chip 154, and a fourth tracer portion 477 disposed on the opposite surface of the insulation layer 461 to connect the second penetration portion 485 and the fourth connection portion 489. The first to fourth connection portions 471, 479, 481 and 481 may be provided in a landing pad shape.

In the first and second cross-connection vias 470 and 480, the first and second penetration portions 475 and 485 are disposed at positions shifted from the chip selection vias 212, 213 216 and 217 and are connected using the tracer portions 473, 477, 483 and 487. Thus, the first and second penetration portions 475 and 485 may be detoured to cross-connect the chip selection vias 212 and 213, 216 and 217 of the fourth and fifth semiconductor chips 154 and 155.

Data sheets of Tables 6 and 7 below show the chip selection using the chip selection vias of the semiconductor chips 100 in the 8-layer semiconductor package. Table 6 shows the chip selection of the first to fourth semiconductor chips, and Table 7 shows the chip selection of the fifth to eighth semiconductor chips. The package depicted in FIG. 9 shows that no signals are transferred to the chip selection vias disconnected by the first to third connection units 440, 445 and 460, and values of "0" are given thereto.

TABLE 6

| | Binary Expression | | | | | | | | Decimal Expression |
|---|---|---|---|---|---|---|---|---|---|
| Fourth Layer | select 1 | 0 | select 2 | 0 | select 3 | 0 | select 4 | 0 | 0 |
| Third Layer | select 1 | 0 | select 2 | 0 | select 3 | 0 | select 4 | 0 | 0 |
| Second Layer | select 1 | 1 | select 2 | 0 | select 3 | 1 | select 4 | 0 | 10 |
| First Layer (selected) | select 1 | 0 | select 2 | 1 | select 3 | 0 | select 4 | 1 | 5 |
| Signal | | 0 | | 1 | | 0 | | 1 | |
| Fourth Layer | select 1 | 0 | select 2 | 0 | select 3 | 1 | select 4 | 0 | 2 |
| Third Layer | select 1 | 0 | select 2 | 1 | select 3 | 0 | select 4 | 0 | 4 |
| Second Layer (selected) | select 1 | 1 | select 2 | 1 | select 3 | 1 | select 4 | 0 | 14 |
| First Layer | select 1 | 0 | select 2 | 1 | select 3 | 1 | select 4 | 1 | 7 |
| Signal | | 0 | | 1 | | 1 | | 1 | |
| Fourth Layer | select 1 | 1 | select 2 | 0 | select 3 | 1 | select 4 | 0 | 10 |
| Third Layer (selected) | select 1 | 0 | select 2 | 1 | select 3 | 0 | select 4 | 1 | 5 |
| Second Layer | select 1 | 1 | select 2 | 1 | select 3 | 0 | select 4 | 1 | 13 |
| First Layer | select 1 | 1 | select 2 | 0 | select 3 | 1 | select 4 | 1 | 11 |
| Signal | | 1 | | 0 | | 1 | | 1 | |
| Fourth Layer (selected) | select 1 | 1 | select 2 | 0 | select 3 | 0 | select 4 | 0 | 8 |
| Third Layer | select 1 | 0 | select 2 | 0 | select 3 | 0 | select 4 | 1 | 1 |
| Second Layer | select 1 | 1 | select 2 | 0 | select 3 | 0 | select 4 | 1 | 9 |
| First Layer | select 1 | 1 | select 2 | 0 | select 3 | 0 | select 4 | 1 | 9 |
| Signal | | 1 | | 0 | | 0 | | 1 | |

From the result shown in Table 6, the selective chip selection with respect to the first to fourth semiconductor layers 151, 152, 153 and 154 of each layer may be achieved by applying different selection signals (select 1, 2, 3, 4) to the first, second, third and fourth chip selection vias 211, 212, 213 and 214 of the first block 301 of the first semiconductor chip 151 of the lowermost layer.

TABLE 7

| | Binary Expression | | | | | | | | Decimal Expression |
|---|---|---|---|---|---|---|---|---|---|
| Eighth Layer | select 1 | 0 | select 2 | 0 | select 3 | 0 | select 4 | 0 | 0 |
| Seventh Layer | select 1 | 0 | select 2 | 0 | select 3 | 0 | select 4 | 0 | 0 |
| Sixth Layer | select 1 | 1 | select 2 | 0 | select 3 | 1 | select 4 | 0 | 10 |
| Fifth Layer (selected) | select 1 | 0 | select 2 | 1 | select 3 | 0 | select 4 | 1 | 5 |
| Fourth Layer | select 1 | 0 | select 2 | 0 | select 3 | 1 | select 4 | 1 | 3 |
| Third Layer | select 1 | 0 | select 2 | 0 | select 3 | 1 | select 4 | 1 | 3 |
| Second Layer | select 1 | 0 | select 2 | 0 | select 3 | 1 | select 4 | 1 | 3 |
| First Layer | select 1 | 0 | select 2 | 0 | select 3 | 1 | select 4 | 1 | 3 |
| Signal | | 0 | | 0 | | 1 | | 1 | 3 |

TABLE 7-continued

| | | | | Binary Expression | | | | | Decimal Expression |
|---|---|---|---|---|---|---|---|---|---|
| Eighth Layer | select 1 | 0 | select 2 | 0 | select 3 | 1 | select 4 | 0 | 2 |
| Seventh Layer | select 1 | 0 | select 2 | 1 | select 3 | 0 | select 4 | 0 | 4 |
| Sixth Layer (selected) | select 1 | 1 | select 2 | 1 | select 3 | 1 | select 4 | 0 | 14 |
| Fifth Layer | select 1 | 0 | select 2 | 1 | select 3 | 1 | select 4 | 1 | 7 |
| Fourth Layer | select 1 | 0 | select 2 | 1 | select 3 | 1 | select 4 | 1 | 7 |
| Third Layer | select 1 | 0 | select 2 | 1 | select 3 | 1 | select 4 | 1 | 7 |
| Second Layer | select 1 | 0 | select 2 | 1 | select 3 | 1 | select 4 | 1 | 7 |
| First Layer | select 1 | 0 | select 2 | 1 | select 3 | 1 | select 4 | 1 | 7 |
| Signal | | 0 | | 1 | | 1 | | 1 | 7 |
| Eighth Layer | select 1 | 1 | select 2 | 0 | select 3 | 1 | select 4 | 0 | 10 |
| Seventh Layer (selected) | select 1 | 0 | select 2 | 1 | select 3 | 0 | select 4 | 1 | 5 |
| Sixth Layer | select 1 | 1 | select 2 | 1 | select 3 | 0 | select 4 | 1 | 13 |
| Fifth Layer | select 1 | 1 | select 2 | 0 | select 3 | 1 | select 4 | 1 | 11 |
| Fourth Layer | select 1 | 1 | select 2 | 1 | select 3 | 0 | select 4 | 1 | 13 |
| Third Layer | select 1 | 1 | select 2 | 1 | select 3 | 0 | select 4 | 1 | 13 |
| Second Layer | select 1 | 1 | select 2 | 1 | select 3 | 0 | select 4 | 1 | 13 |
| First Layer | select 1 | 1 | select 2 | 1 | select 3 | 0 | select 4 | 1 | 13 |
| Signal | | 1 | | 1 | | 0 | | 1 | 13 |
| Eighth Layer (selected) | select 1 | 1 | select 2 | 0 | select 3 | 0 | select 4 | 0 | 8 |
| Seventh Layer | select 1 | 0 | select 2 | 0 | select 3 | 0 | select 4 | 1 | 1 |
| Sixth Layer | select 1 | 1 | select 2 | 0 | select 3 | 0 | select 4 | 1 | 9 |
| Fifth Layer | select 1 | 1 | select 2 | 0 | select 3 | 0 | select 4 | 1 | 9 |
| Fourth Layer | select 1 | 1 | select 2 | 0 | select 3 | 0 | select 4 | 1 | 9 |
| Third Layer | select 1 | 1 | select 2 | 0 | select 3 | 0 | select 4 | 1 | 9 |
| Second Layer | select 1 | 1 | select 2 | 0 | select 3 | 0 | select 4 | 1 | 9 |
| First Layer | select 1 | 1 | select 2 | 0 | select 3 | 0 | select 4 | 1 | 9 |
| Signal | | 1 | | 0 | | 0 | | 1 | 9 |

From the result of Table 7, the selective chip selection of the fifth to eighth semiconductor layers 155, 156, 157 and 158 of each layer may be achieved by applying different selection signals (select 1, 2, 3, 4) to the fifth, sixth, seventh and eighth chip selection vias 215, 216, 217 and 218 of the second block 303 of the first semiconductor chip 151 of the lowermost layer. The first, second, third and fourth chip selection vias 211, 212, 213 and 214 are common to the selection signals (select 1, 2, 3 and 4).

According to the embodiments of the present invention, even though the semiconductor chips 100 with the built-in chip selection logic units having the same type are stacked and the TSVs including the chip selection vias 200 arranged in the same type are mutually connected, a specific one of the semiconductor chips 100 can be achieved using the multi signals. Therefore, the multilayer stack semiconductor package using the TSVs can be more effectively implemented.

According to the embodiments of the present invention, the semiconductor package can select a specific chip using through-vias while stacking the same semiconductor chips.

What is claimed is:

1. A semiconductor package comprising:
    a plurality of semiconductor chips stacked while each having an arrangement of chip selection vias;
    a first connection unit provided between a first semiconductor chip and a second semiconductor chip stacked adjacent to each other, and configured to mutually connect some of the chip selection vias of the first and second semiconductor chips and disconnect the others of the chip selection vias of the first and second semiconductor chips; and
    a second connection unit provided between the first semiconductor chip and a third semiconductor chip stacked under the first semiconductor chip, and configured to connect chip selection vias of the first and third chip selection vias in inverse order of arrangement,
    wherein, when the chip selection vias comprises first, second, third and fourth vias sequentially arranged in one direction, the second connection unit mutually connects the first via of the first semiconductor chip and the fourth via of the third semiconductor chip, and mutually connects the second via of the first semiconductor chip and the third via of the third semiconductor chip.

2. The semiconductor package of claim 1, wherein the semiconductor chips are the same type of chips.

3. The semiconductor package of claim 1, wherein the semiconductor chips comprise the chip selection vias having the same arrangement.

4. The semiconductor package of claim 1, wherein the semiconductor chips comprise as many chip selection vias as the stacked semiconductor chips.

5. The semiconductor package of claim 1, further comprising a third connection unit provided between the second semiconductor chip and a fourth semiconductor chip stacked on the second semiconductor chip, and configured to connect chip selection vias of the second and fourth chip selection vias in an inverse order of arrangement.

6. The semiconductor package of claim 5, wherein the third connection unit is provided such that the fourth semiconductor chip is stacked in a flip chip type with respect to the second semiconductor chip.

7. The semiconductor package of claim 1, wherein the first connection unit is provided such that the number of the connected chip selection vias of the first and second semiconductor chips is equal to the number of the disconnected chip selection vias of the first and second semiconductor chips.

8. The semiconductor package of claim 1, wherein the first connection unit comprises:
    an insulation layer insulating the first and second semiconductor chips; and
    connection vias passing through the insulation layer and corresponding to the chip selection vias to be connected.

9. The semiconductor package of claim 8, wherein the connection vias are disposed corresponding to every two chip selection vias to alternately connect and disconnect the chip selection vias.

10. The semiconductor package of claim 8, wherein the first connection unit further comprises disconnection vias obliquely passing through the insulation layer and mismatched with the chip selection vias to be disconnected.

11. The semiconductor package of claim 1, wherein the second connection unit is provided such that the third semiconductor chip is stacked in a flip chip type with respect to the first semiconductor chip.

12. The semiconductor package of claim 1, wherein, when the third semiconductor chip is stacked in a flip chip type with respect to the first semiconductor chip and interlayer overlap positions of the chip selection vias are mismatched, the semiconductor package further comprises a third connection unit including:
first and second insulation layers provided between the third semiconductor chip and the first semiconductor chip;
oblique connection vias passing through the first insulation layer and connected to the chip selection vias of the first semiconductor chip; and
vertical connection vias passing through the second insulation layer and connected to the oblique connection vias and the chip selection vias of the third semiconductor chips.

13. A semiconductor package comprising:
first, second, third and fourth semiconductor chips stacked while having an arrangement of chip selection vias; and
a connection unit provided between a second semiconductor chip and a third semiconductor chip, and configured to mutually connect some of the chip selection vias of the second and third semiconductor chips and disconnect the others of the chip selection vias of the second and third semiconductor chips,
wherein the first and second semiconductor chips and the third and fourth semiconductor chips are stacked in a flip chip type,
wherein the first and second semiconductor chips are stacked in a flip chip type so that the chip selection vias are mutually connected in inverse order of arrangement, and
wherein, due to the flip chip type stacking and the mutual connection of the chip selection vias by the connection unit, when multi signals "A, B, C, D" each having a value of "0" or "1" are applied to the chip selection vias of the first semiconductor chip, different signal values are applied to the first to fourth semiconductor chips to thereby achieve chip selection.

14. The semiconductor package of claim 13, wherein the semiconductor chips are the same type of chips.

15. The semiconductor package of claim 13, wherein the semiconductor chips comprise as many chip selection vias as the stacked semiconductor chips.

16. The semiconductor package of claim 13, wherein the connection unit is provided such that the number of the connected chip selection vias of the second and third semiconductor chips is equal to the number of the disconnected chip selection vias of the second and third semiconductor chips.

17. The semiconductor package of claim 13, wherein the connection unit comprises:
an insulation layer insulating the second and third semiconductor chips; and
connection vias passing through the insulation layer and corresponding to the chip selection vias to be connected.

18. The semiconductor package of claim 17, wherein the connection vias are disposed corresponding to every two chip selection vias to alternately connect and disconnect the chip selection vias.

19. The semiconductor package of claim 17, wherein the connection unit further comprises disconnection vias obliquely passing through the insulation layer and mismatched with the chip selection vias to be disconnected.

20. The semiconductor package of claim 13, wherein the third semiconductor chip is stacked in a flip chip type with respect to the second semiconductor chip, such that the same surfaces are faced with each other or the opposite surfaces are faced with each other.

21. A semiconductor package comprising:
a first, a second and a third semiconductor chip stacked while having an arrangement of chip selection vias; and
a first connection unit provided between the second semiconductor chip and the third semiconductor chip, and configured to mutually connect some of the chip selection vias of the second and third semiconductor chips and disconnect the others of the chip selection vias of the second and third semiconductor chips,
a second connection unit provided between the second semiconductor chip and the first semiconductor chip stacked under the second semiconductor chip, and configured to connect chip selection vias of the first and second chip selection vias in inverse order of arrangement,
wherein the first and second semiconductor chips are stacked in a flip chip type, and
wherein when the chip selection vias comprise first, second, third and fourth vias sequentially arranged in one direction, the second connection unit mutually connects the first via of the first semiconductor chip and the fourth via of the second semiconductor chip, and mutually connects the second via of the first semiconductor chip and the third via of the second semiconductor chip.

22. The semiconductor package of claim 21, wherein, due to the flip chip type stacking of the first and second semiconductor chips, the chip selection vias are mutually connected in inverse order of arrangement.

23. The semiconductor package of claim 21, wherein, when the second semiconductor chip is stacked in a flip chip type with respect to the first semiconductor chip and interlayer overlap positions of chip selection vias comprising the first semiconductor chip and the second semiconductor chip are mismatched, the semiconductor package further comprises a third connection unit including:
first and second insulation layers provided between the second semiconductor chip and the first semiconductor chip;
oblique connection vias passing through the first insulation layer and connected to chip selection vias of the first semiconductor chip; and
vertical connection vias passing through the second insulation layer and connected to oblique connection vias and chip selection vias of the third semiconductor chips.

24. The semiconductor package of claim 21, wherein the first connection unit is provided such that the number of connected chip selection vias of the second and third semiconductor chips is equal to the number of disconnected chip selection vias of the second and third semiconductor chips.

25. The semiconductor package of claim 21, wherein the first connection unit alternately connects and disconnects the chip selection vias.

26. A semiconductor package comprising:
a first semiconductor chip, a second semiconductor chip and a third semiconductor chip stacked wherein each of the first, second and third semiconductor chip have an arrangement of first to fourth chip selection vias;
a first connection unit provided between the second semiconductor chip and the third semiconductor chip and configured to mutually connect some chip selection vias of the second and third semiconductor chips and disconnect other chip selection vias of the second and third semiconductor chips; and
a second connection unit configured to connect a first chip selection via of the first semiconductor chip and a fourth chip selection via of the second semiconductor chip, connect a second chip selection via of the first semiconductor chip and a third chip selection via of the second semiconductor chip, connect a third chip selection via of the first semiconductor chip and a second chip selection via of the second semiconductor chip, and connect a fourth chip selection via of the first semiconductor chip and a first chip selection via of the second semiconductor chip.

27. The semiconductor package of claim 26, wherein the second semiconductor chip is stacked in a flip chip type with respect to the first semiconductor chip.

28. The semiconductor package of claim 26, further comprising a fourth semiconductor chip stacked in a flip chip type with respect to the third semiconductor chip, and the flip chip type stacking connects a first chip selection via of the third semiconductor chip and a fourth chip selection via of the fourth semiconductor chip, connects a second chip selection via of the third semiconductor chip and a third chip selection via of the fourth semiconductor chip, connects a third chip selection via of the third semiconductor chip and a second chip selection via of the fourth semiconductor chip, and connects a fourth chip selection via of the third semiconductor chip and a first chip selection via of the fourth semiconductor chip.

29. A semiconductor package comprising:
first, second, third and fourth semiconductor chips each having an arrangement of first to eighth chip selection vias and stacked in a flip chip type;
a first connection unit provided between the second semiconductor chip and the third semiconductor chip and configured to mutually connect some chip selection vias of the second and third semiconductor chips, which are disposed corresponding to the first to fourth chip selection vias of the first semiconductor chip, disconnect others of the chip selection vias of the second and third semiconductor chips, and connect chip selection vias of the second and third semiconductor chips, which are disposed corresponding to fifth to eighth chip selection vias of the first semiconductor chip;
fifth to eighth semiconductor chips stacked on the fourth semiconductor chip in at least one of the same order as the first to fourth semiconductor chips or in inverse order thereof; and
a second connection unit provided between the fourth semiconductor chip and the fifth semiconductor chip and configured to connect chip selection vias of the fourth and fifth semiconductor chips, which are disposed corresponding to the fifth to eighth chip selection vias of the first semiconductor chips, and disconnect chip selection vias of the fourth and fifth semiconductor chips, which are disposed corresponding to the first to fourth chip selection vias of the first semiconductor chip.

30. The semiconductor package of claim 29, wherein the semiconductor chips are the same type of chips.

31. The semiconductor package of claim 29, wherein the semiconductor chips comprise the first to eighth chip selection vias sequentially arranged in one direction.

32. The semiconductor package of claim 29, wherein the first and second semiconductor chips are stacked in a flip chip type so that chip selection vias comprising the first and second semiconductor chips are mutually connected in inverse order of arrangement.

33. The semiconductor package of claim 29, wherein, due to the flip chip type stacking and a mutual connection of chip selection vias by the first and second connection units, when multi signals "A, B, C, D" each having a value of "0" or "1" are applied to the first to fourth chip selection vias of the first semiconductor chip, different signal values are applied to the first to fourth semiconductor chips to thereby achieve chip selection, and
when multi signals "E, F, G, H" having a value of "0" or "1" are applied to the fifth to eighth chip selection vias of the first semiconductor chip, different signal values are applied to the fifth to eighth semiconductor chips to thereby achieve chip selection.

34. The semiconductor package of claim 29, wherein the first connection unit is provided such that the number of connected chip selection vias of the second and third semiconductor chips, which are disposed corresponding to the first to fourth chip selection vias of the first semiconductor chip, is equal to the number of disconnected chip selection vias of the second and third semiconductor chips.

35. The semiconductor package of claim 29, wherein the first connection unit alternately connects and disconnects the chip selection vias of the second and third semiconductor chips, which are disposed corresponding to the first to fourth chip selection vias of the first semiconductor chip.

36. The semiconductor package of claim 29, wherein the first connection unit comprises:
an insulation layer insulating the second and third semiconductor chips; and
connection vias passing through the insulation layer and corresponding to the chip selection vias to be connected.

37. The semiconductor package of claim 29, wherein the second connection unit comprises:
an insulation layer; and
cross-connection vias passing through the insulation layer and cross-connecting the chip selection vias of the fourth and fifth semiconductor chips, which are disposed corresponding to the sixth and seventh chip selection vias of the first semiconductor chip.

* * * * *